(12) United States Patent
Dennard et al.

(10) Patent No.: US 8,473,762 B2
(45) Date of Patent: Jun. 25, 2013

(54) POWER DELIVERY IN A HETEROGENEOUS 3-D STACKED APPARATUS

(75) Inventors: Robert H. Dennard, Yorktown Heights, NY (US); Eren Kursun, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/552,091

(22) Filed: Jul. 18, 2012

(65) Prior Publication Data

US 2012/0284541 A1 Nov. 8, 2012

Related U.S. Application Data

(62) Division of application No. 12/623,462, filed on Nov. 23, 2009, now Pat. No. 8,276,002.

(51) Int. Cl.
| | |
|---|---|
| *G06F 1/00* | (2006.01) |
| *G06F 1/26* | (2006.01) |
| *H01L 23/02* | (2006.01) |
| *H01L 23/52* | (2006.01) |
| *H02J 1/10* | (2006.01) |
| *B23K 11/24* | (2006.01) |

(52) U.S. Cl.
USPC ........... 713/300; 713/320; 713/324; 257/686; 257/691

(58) Field of Classification Search
USPC ..... 713/300, 320, 324; 257/686, 691; 307/43; 323/318; 363/13; 703/18
See application file for complete search history.

(56) References Cited

U.S. PATENT DOCUMENTS

| | | | |
|---|---|---|---|
| 4,752,699 A | 6/1988 | Cranford, Jr. et al. | |
| 5,270,581 A | 12/1993 | Nakamura | |
| 5,581,506 A | 12/1996 | Yamauchi | |
| 5,631,816 A | 5/1997 | Brakus | |
| 5,867,040 A | 2/1999 | Fuse et al. | |
| 5,897,040 A | 4/1999 | Ward | |
| 6,075,401 A | 6/2000 | Inoue et al. | |
| 6,204,141 B1 * | 3/2001 | Lou | 438/386 |
| 6,304,068 B1 | 10/2001 | Hui et al. | |
| 6,600,220 B2 * | 7/2003 | Barber et al. | 257/685 |
| 6,600,679 B2 | 7/2003 | Tanzawa et al. | |

(Continued)

FOREIGN PATENT DOCUMENTS

| | | |
|---|---|---|
| JP | 60239117 A | 11/1985 |
| WO | 2007054858 A2 | 5/2007 |

OTHER PUBLICATIONS

Charge Pumps: An Overview, Louie Pylarinos, Proceedings of IEEE International Symposium on Circuits and Systems, 2003, pp. 1-7.
Cockcroft-Walton generator, Dec. 15, 2005, pp. 1-3.

(Continued)

*Primary Examiner* — Stefan Stoynov
(74) *Attorney, Agent, or Firm* — Cantor Colburn LLP; William Stock

(57) ABSTRACT

A heterogeneous three-dimensional (3-D) stacked apparatus is provided that includes multiple layers arranged in a stacked configuration with a lower layer configured to receive a board-level voltage and one or more upper layers stacked above the lower layer. The heterogeneous 3-D stacked apparatus also includes multiple tiles per layer, where each tile is designed to receive a separately regulated voltage. The heterogeneous 3-D stacked apparatus additionally includes at least one layer in the one or more upper layers with voltage converters providing the separately regulated voltage converted from the board-level voltage.

5 Claims, 5 Drawing Sheets

U.S. PATENT DOCUMENTS

| | | |
|---|---|---|
| 6,617,903 B2 | 9/2003 | Kawamura |
| 6,646,425 B2 | 11/2003 | Miftakhutdinov |
| 6,657,420 B1 | 12/2003 | Shacter |
| 6,744,297 B2 | 6/2004 | Huang |
| 6,838,927 B2 | 1/2005 | Oonishi |
| 7,051,306 B2 | 5/2006 | Hoberman et al. |
| 7,095,619 B2 | 8/2006 | Panella et al. |
| 7,116,594 B2 | 10/2006 | Luk et al. |
| 7,190,210 B2 | 3/2007 | Azrai et al. |
| 7,230,455 B2 | 6/2007 | Luk |
| 7,257,723 B2 | 8/2007 | Galles |
| 7,315,463 B2 * | 1/2008 | Schrom et al. ............ 363/148 |
| 7,342,389 B1 | 3/2008 | Wu et al. |
| 7,348,800 B2 | 3/2008 | Koto et al. |
| 7,358,573 B2 | 4/2008 | Cecchi et al. |
| 7,518,481 B2 * | 4/2009 | Gardner et al. ............ 336/200 |
| 7,551,018 B2 | 6/2009 | Hsu et al. |
| 7,564,263 B2 | 7/2009 | Walker et al. |
| 7,581,198 B2 | 8/2009 | Huynh et al. |
| 7,609,114 B2 | 10/2009 | Hsieh et al. |
| 7,750,717 B2 | 7/2010 | Ali et al. |
| 7,768,309 B2 | 8/2010 | Luich |
| 2002/0024374 A1 | 2/2002 | Ovens et al. |
| 2003/0155897 A1 * | 8/2003 | Miftakhutdinov ............ 323/282 |
| 2005/0140426 A1 | 6/2005 | Fujiwara |
| 2005/0145895 A1 | 7/2005 | Luk |
| 2005/0213267 A1 | 9/2005 | Azrai et al. |
| 2005/0213280 A1 | 9/2005 | Azrai et al. |
| 2006/0071650 A1 | 4/2006 | Narendra et al. |
| 2006/0099734 A1 | 5/2006 | Narendra et al. |
| 2006/0139086 A1 | 6/2006 | Heinz et al. |
| 2008/0079461 A1 | 4/2008 | Lin et al. |
| 2008/0080111 A1 | 4/2008 | Lin et al. |
| 2008/0080112 A1 | 4/2008 | Lin et al. |
| 2008/0080113 A1 | 4/2008 | Lin et al. |
| 2008/0081457 A1 | 4/2008 | Lin et al. |
| 2008/0081458 A1 | 4/2008 | Lin et al. |
| 2008/0111242 A1 | 5/2008 | Lin et al. |
| 2008/0162770 A1 | 7/2008 | Titiano et al. |
| 2008/0239772 A1 | 10/2008 | Oraw et al. |
| 2009/0033155 A1 | 2/2009 | Kanno et al. |
| 2009/0059653 A1 | 3/2009 | Luk et al. |
| 2009/0103382 A1 | 4/2009 | Luk et al. |
| 2009/0289291 A1 | 11/2009 | Cheng et al. |
| 2010/0033224 A1 | 2/2010 | Acharya |
| 2010/0214014 A1 | 8/2010 | Dennard et al. |
| 2011/0121811 A1 | 5/2011 | Dennard et al. |

OTHER PUBLICATIONS

D. Maurath et al.; "A self-adaptive switched-capacitor voltage converter with dynamic input load control for energy harvesting;" Proc. ESSCIRC; Sep. 14-18, 2009; pp. 284-287.

D. Stepanovic et al.; "Gated-diode Sense Amplifier for Robust Differential sensing in 6T SRAM;" Univ. of California, Berkeley; published on-line; May 3, 2007; pp. 1-6.

F H Khan et al., "A 5 kW Bi-directional Multilevel Modular DC-DC Converter (MMCCC) Featuring Built in Power Management for Fuel Cell and Hybrid Electric Automobiles," Vehicle Power and Propulsion Conference; Sep. 9, 2007, pp. 208-214, IEEE.

Gerhard Schrom, et al., Feasibility of Monolithic and 3D-Stacked DC-DC Converters for Microprocessors in 90nm Technology Generation, Copyright 2004 ACM, 6 pages.

International Search Report; International Application No. PCT/EP2010/051288; International Filing Date: Feb. 3, 2010; Date of mailing: Jun. 21, 2010; 5 pages.

J. Kwong et al.; "A 65 nm Sub-V Sub-t Microcontroller With Integrated SRAM and Switched Capacitor DC-DC Converter;" IEEE Journal of Solid-State Circuits, vol. 44, Jan. 1, 2009; pp. 115-126.

U.S. Appl. No. 12/422,391; Notice of Allowance, filed Apr. 13, 2009; Date Mailed: Jan. 9, 2012.

U.S. Appl. No. 12/392,476; Final Office Action, filed Feb. 25, 2009; Date Mailed: Feb. 9, 2012; pp. 1-9.

U.S. Appl. No. 12/392,476; Non-Final Office Action, filed Feb. 25, 2009; Date Mailed Oct. 25, 2011.

U.S. Appl. No. 12/623,462; Non-Final Office Action, filed Nov. 23, 2009; Date Mailed: Feb. 6, 2012; pp. 1-26.

U.S. Appl. No. 12/422,391; Final Office Action, filed Apr. 13, 2009; Date Mailed: Sep. 7, 2011.

W. K. Luk et al.; "Gated-Diode Amplifiers;" IEEE Transaction on Circuits and Systems -II: Express Briefs, vol. 52, No. 5; May 2005, pp. 266-270.

Written Opinion of the International Searching Authority; International Application No. PCT/EP2010/051288; International Filing Date: Feb. 3, 2010; Date of mailing: Jun. 21, 2010; 5 pages.

International Search Report; International Application No. PCT/US/10/26748; International Filing Date: Mar. 10, 2010; Date of mailing: May 3, 2010; 7 pages.

Written Opinion; International Application No. PCT/US/10/26748; International Filing Date: Mar. 10, 2010; Date of mailing: May 3, 2010; 5 pages.

* cited by examiner

POWER DELIVERY IN A HETEROGENEOUS 3-D STACKED APPARATUS

CROSS-REFERENCE TO RELATED APPLICATION

This application is a divisional of U.S. patent application Ser. No. 12/623,462, filed Nov. 23, 2009, now U.S. Pat. No. 8,276,002, the disclosure of which is incorporated by reference herein in its entirety.

BACKGROUND

This invention relates generally to electrical power delivery, and more particularly to power delivery in a heterogeneous three-dimensional stacked apparatus.

In distributing electrical power to an apparatus with multiple layers, the supply voltage can suffer voltage variations and IR drops between the lower layer and upper layers, where the apparatus receives a supply voltage at the lower layer. Voltage variations are fluctuations in voltage, and IR drops are static and dynamic losses on resistive loads in a current path. The IR drops become even more prominent in tungsten-based through-silicon-via (TSV) technologies. IR drops through tungsten-based TSVs may be attributed to electrical conductivity characteristics of tungsten, as well as aspect ratio and metallization limitations. Number, area, and placement restrictions on TSVs can also increase the IR drops between the layers. Board-level controlled collapse chip connection (C4) pitch restrictions and finer pitched power/ground vias can limit the efficiency of power delivery to the stacked layers. Power loss during voltage conversion between layers also reduces the overall energy efficiency of the apparatus.

A heterogeneous three-dimensional (3-D) stacked apparatus with multiple layers has further design challenges for power distribution. Individual device layers of a heterogeneous 3-D stacked apparatus can have different requirements in terms of target supply voltage, voltage variations sensitivity, and the like, including different requirements per layer and for tiles of the same layer. Power and thermal requirements can limit the ability to integrate a variety of technologies, architectures, and/or functionality into a heterogeneous 3-D stacked apparatus.

SUMMARY

An exemplary embodiment is a heterogeneous three-dimensional (3-D) stacked apparatus that includes multiple layers arranged in a stacked configuration with a lower layer configured to receive a board-level voltage and one or more upper layers stacked above the lower layer. The heterogeneous 3-D stacked apparatus also includes multiple tiles per layer, where each tile is designed to receive a separately regulated voltage. The heterogeneous 3-D stacked apparatus additionally includes at least one layer in the one or more upper layers with voltage converters providing the separately regulated voltage converted from the board-level voltage.

Another exemplary embodiment is a 3-D power delivery controller for power delivery management in a heterogeneous 3-D stacked apparatus. The heterogeneous 3-D stacked apparatus includes multiple layers arranged in a stacked configuration with multiple tiles per layer. The 3-D power delivery controller includes a voltage control table defining voltage requirements and conversion efficiencies for separate tiles of a heterogeneous 3-D stacked apparatus. The 3-D power delivery controller also includes control logic configured to scan the voltage control table for changes, calculate voltage regulation commands for voltage converters in the heterogeneous 3-D stacked apparatus, and distribute the calculated voltage regulation commands to the voltage converters to control voltage on a tile basis.

A further exemplary embodiment is a method of controlling power delivery in a heterogeneous 3-D stacked apparatus. The heterogeneous 3-D stacked apparatus includes multiple layers arranged in a stacked configuration with multiple tiles per layer. A voltage control table defining voltage requirements and conversion efficiencies for separate tiles of the heterogeneous 3-D stacked apparatus is read and scanned for changes. In response to locating changes in the voltage control table, voltage regulation commands are calculated for voltage converters in the heterogeneous 3-D stacked apparatus. The calculated voltage regulation commands are distributed to the voltage converters to control voltage on a tile basis.

Other systems, methods, apparatuses, and/or design structures according to embodiments will be or become apparent to one with skill in the art upon review of the following drawings and detailed description. It is intended that all such additional systems, methods, apparatuses, and/or design structures be included within this description, be within the scope of the present invention, and be protected by the accompanying claims.

BRIEF DESCRIPTION OF THE SEVERAL VIEWS OF THE DRAWINGS

Referring now to the drawings wherein like elements are numbered alike in the several FIGURES.

DETAILED DESCRIPTION

The invention as described herein provides power delivery in a heterogeneous three-dimensional (3-D) stacked apparatus. In heterogeneous 3-D stacks, individual device layers can be implemented in disparate technologies, with different characteristics and voltage requirements. Heterogeneous 3-D stacks can also include different architectures and/or functionality between layers. For instance, one layer in a 3-D stack can be a traditional complementary metal-oxide-semiconductor (CMOS) processor layer in 22 nm technology with another layer in 90 nm technology, a third layer can be a phase-change memory (PCM) or a magnetoresistive random access memory (MRAM) type memory layer, a fourth layer can be an analog layer, and a fifth layer may be a field programmable gate array (FPGA) layer. Since the 3-D stack is heterogeneous, each layer has potentially different supply voltage targets, as well as different voltage variation levels and sensitivities. In exemplary embodiments, power delivery to a heterogeneous 3-D stacked apparatus is provided by controlling delivery to each tile in the 3-D stack, and accounting for layer and/or tile-specific voltage variation sensitivities, voltage converter efficiencies, and IR drops in power delivery paths. A 3-D power delivery controller predicts and optimizes supply current levels to minimize voltage variation and IR drop, while improving the energy efficiency.

Figure 1:
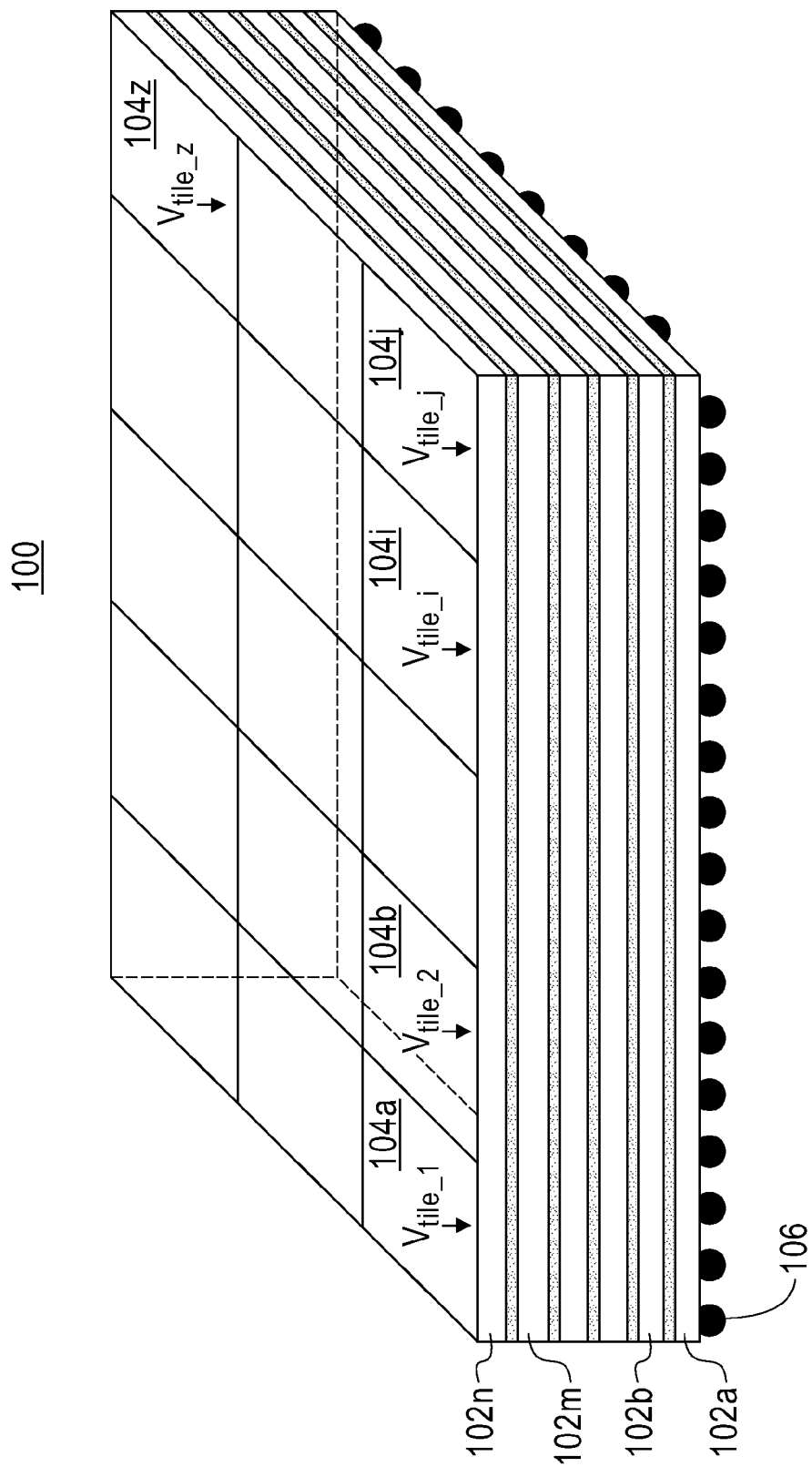
FIG. 1 depicts a heterogeneous three-dimensional stacked apparatus that may be implemented in exemplary embodiments.

FIG. 1 depicts a heterogeneous 3-D stacked apparatus 100 that may be implemented in exemplary embodiments. The heterogeneous 3-D stacked apparatus 100 includes multiple layers 102a-102n, where n is an arbitrary number. In the stacked configuration of the heterogeneous 3-D stacked apparatus 100, layer 102a is a lower layer configured to receive a board-level voltage and layers 102b-102n are upper layers stacked above the lower layer. Each layer 102 can include multiple tiles 104a-104z, where tiles 104a-104j extend in a first dimension, and tiles 104j-104z extend in a second dimension. Tiles 104j and 104z represent arbitrary identifiers that can support a wide variety of two-dimensional configurations. The number of tiles 104 can also vary for each layer 102. A "tile" is a logical partition with a separately regulated voltage in a common layer. Thus, on layer 102n, tile 104a may receive voltage Vtile_1, while tiles 104b, 104i, 104j, and 104z receive voltages Vtile_2, Vtile_i, Vtile_j, and Vtile_z. Tiles 104 can also be grouped as regions. Each tile 104 is designed to receive a separately regulated voltage selected from multiple delivery paths per tile 104, where voltage converters in one or more of the layers 102a-102n provide the separately regulated voltage converted from the board-level voltage. The voltage converter/regulator structures in the upper layers of the stack (as well as the bottom layer) enable delivering the power to the circuits in the upper layers at high voltage in order to minimize the IR drop. Additional information describing the operation and topology of voltage converter circuits and stacked voltage domains that may be implemented in exemplary embodiments can be found in co-pending U.S. application Ser. No. 12/392,476, filed Feb. 25, 2009, and in co-pending U.S. application Ser. No. 12/422,391, filed Apr. 13, 2009, the contents of which are incorporated by reference herein in their entirety.

The supply voltage for Vtile_1-Vtile_z is received through connectors 106, with distributed voltage conversion and regulation applied in the heterogeneous 3-D stacked apparatus 100 to meet the individual demands per layer 102 and tile 104. The connectors 106 can be any type of connector known in the art to electrically connect the heterogeneous 3-D stacked apparatus 100 to a board. Power is delivered from the board through one or more conversions in vertical paths to specific layers 102 and tiles 104. In one embodiment, the connectors 106 are controlled collapse chip connection (C4) connectors. It will be understood that the connectors 106 are partitioned such that some connectors 106 carry power and ground signals, while others may carry clock, address, data, command, and status signals.

Figure 2:
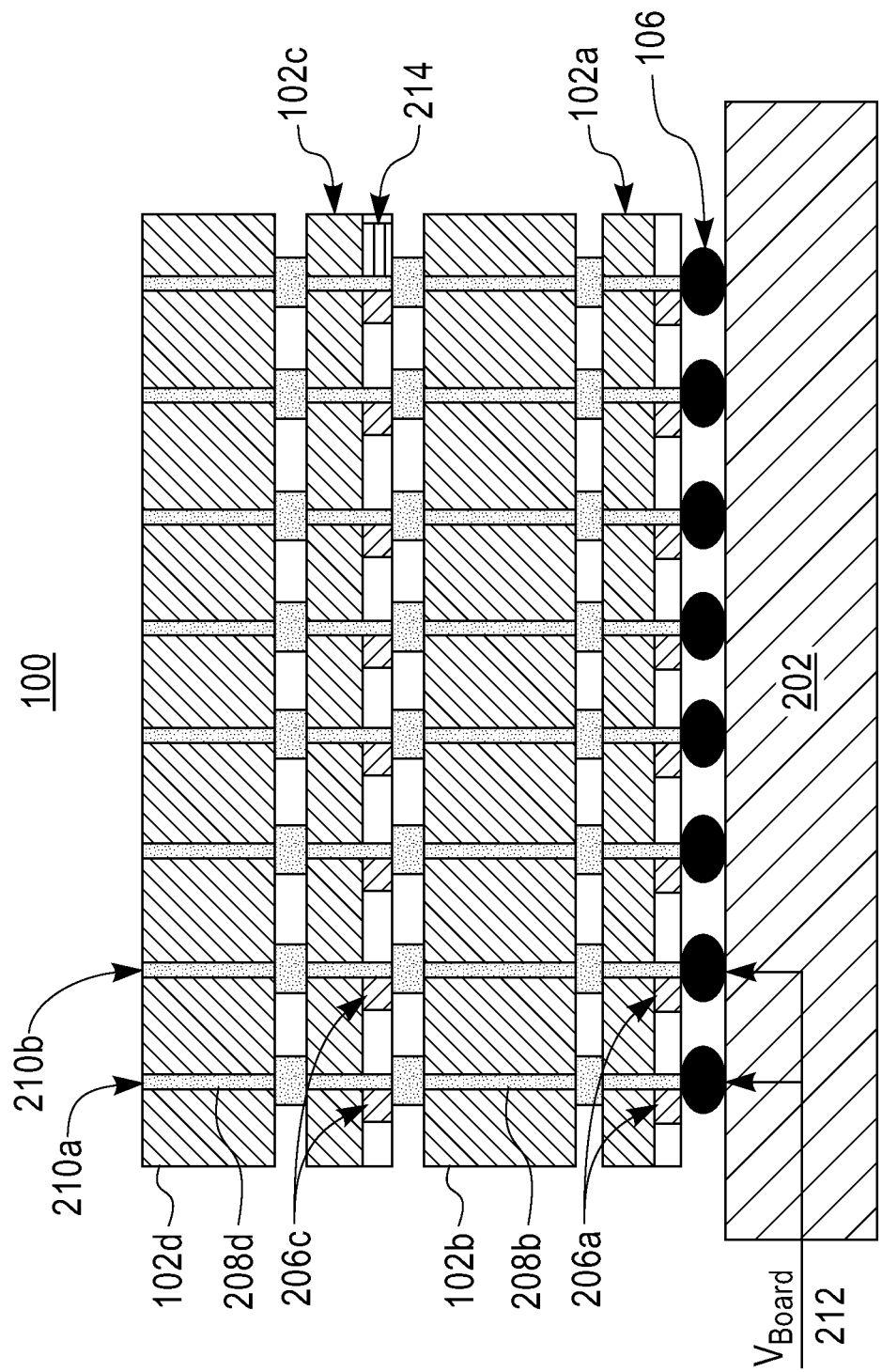
FIG. 2 depicts a cross-sectional view of a heterogeneous three-dimensional stacked apparatus that may be implemented in exemplary embodiments.

FIG. 2 depicts a cross-sectional view of a portion of the heterogeneous 3-D stacked apparatus 100 of FIG. 1 in accordance with an exemplary embodiment. In FIG. 2, the connectors 106 couple the heterogeneous 3-D stacked apparatus 100 to a board 202, establishing electrically conductivity. The board 202 can be a motherboard, module, or assembly supporting horizontal or vertical configurations. The example of FIG. 2 illustrates 4 layers of the heterogeneous 3-D stacked apparatus 100, layer 102a, 102b, 102c, and 102d, although a greater or lesser number of layers can be incorporated into the heterogeneous 3-D stacked apparatus 100. Each of the layers 102 can include different technologies and circuits with varying power supply requirements. For instance, layer 102b can be an analog layer and layer 102d may be a processor layer, while additional layers 102 can include configurable logic and embedded memory devices. The arrangement of the layers 102 may be based on voltage requirements, as well as interconnectivity and functional characteristics.

The layers 102 include one or more layers for voltage regulation. In order to do voltage conversion as well as regulation, these layers include high-quality passive energy storage elements (e.g., inductors or capacitors). In the case that layers 102 include embedded DRAM memory, passive energy storage elements included as part of the embedded DRAM memory can be used to implement the voltage converters. Examples of high-quality passive energy storage elements used for voltage conversion circuitry include deep trench or stacked capacitors. As depicted in FIG. 2, layer 102a includes voltage converters 206a, and layer 102c includes voltage converters 206c. Supply voltage may be distributed between layers 102 using through silicon-vias (TSVs) 208. TSV 208b allows current to flow from layer 102a through layer 102b to layer 102c. Similarly, TSV 208d allows current to flow from layer 102c through layer 102d to higher layers in the heterogeneous 3-D stacked apparatus 100. TSVs 208 and other internal connections collectively form vertical columns 210, such as vertical columns 210a and 210b that allow electrical current to flow from a board-level voltage 212 through connectors 106 and between layers 102 subject to the effects of the voltage converters 206. The voltage converters 206 provide both voltage conversion and voltage regulation capabilities.

The infrastructure of voltage converter/regulators enables delivering power to circuits in upper layers at high voltage. If voltage is carried as a relatively high-voltage value (such as 2V, 3V or even 5V in some cases) and converted to a relatively low voltage, e.g. 1V at the destination, the IR drop on the vertical power delivery path is minimized because of the reduced supply current. Reducing supply current can increase the expected life of components in the heterogeneous 3-D stacked apparatus 100.

The voltage converters 206 can convert the board-level voltage 212 into multiple independent output supply voltages for individual processor cores, cache/memory stacks, and IO circuits on various layers 102 and tiles 104 of the heterogeneous 3-D stacked apparatus 100. Viewing FIG. 2 in conjunction with FIG. 1, it can be seen that 3-D power delivery may be accomplished through combinations of the vertical and horizontal paths, where delivery paths are optimized for power efficiency. For example, the voltage converters 206 may perform level conversions, such as 3-to-1 voltage conversions, as well as regulation to maintain desired target voltages. Voltage regulation may be dependent upon the layer 102 and functional unit requirements for corresponding circuitry (e.g., analog, digital, memory, logic, etc.) in different layers 102 and tiles 104. Layers including voltage converters such as layers 102a and/or 102c can be located near voltage supply sensitive layers in the heterogeneous 3-D stacked apparatus 100 to improve efficiency of power delivery. In an exemplary embodiment, layer 102c is a silicon layer below a voltage supply sensitive processor layer 102d, where layer 102c provides voltage converting/regulating for processing circuitry using voltage converters 206c. Alternatively, layers 102a and/or 102c may be implemented in passive elements for energy storage and conversion and wiring layers of the heterogeneous 3-D stacked apparatus 100, where the switching circuitry resides in an immediately adjacent layer. As a further example, voltage converters 206 can be integrated on the processor layer 102d itself.

Performing voltage conversion closer to the point of power delivery can reduce the IR drop through the vertical columns 210. For instance, assuming that layer 102d requires 1 Volt and the board-level voltage 212 supplies 3 Volts, then voltage converters 206a, voltage converters 206c, or a combination thereof can be used to convert and regulate voltage for layer 102d. Voltage converted and regulated at layer 102a is subject to losses due to the resistance of TSV 208a and other elements of the vertical column 210a, such as micro-bump interlayer interconnects or Cu—Cu interconnect columns, in the current path to layer 102d. If voltage converters 206c are used to regulate and convert voltage for layer 102d, then there is a minimal loss between the point of regulation and delivery, allowing for a lower current draw and minimum IR drop. The optimization reduces power dissipation and temperature, while increasing the overall efficiency of the heterogeneous 3-D stacked apparatus 100. Lateral duplication of voltage converters 206 for each tile 104 with different supply voltage requirements provides additional power routing options. Selectively converting and regulating voltages at different locations within the heterogeneous 3-D stacked apparatus 100 enables optimized power delivery to be realized. In FIG. 2, the voltage delivery is not limited to the vertical columns, but thick metal layers are used to connect converter/regulator structures in all directions—lateral and vertical.

A 3-D power delivery controller 214 manages the distribution and routing of power throughout the heterogeneous 3-D stacked apparatus 100. Although 3-D power delivery controller 214 is depicted in FIG. 2 as part of layer 102c, the 3-D power delivery controller 214 may be implemented or distributed anywhere in the heterogeneous 3-D stacked apparatus 100. The 3-D power delivery controller 214 is configured to control electrical distribution between the board-level voltage 212 and the voltage converters 206 as a function of one or more of: supply voltage requirements, voltage conversion efficiencies, estimated IR drops, estimated tile temperatures, layer maximum power, and total maximum power for the heterogeneous 3-D stacked apparatus 100. The 3-D power delivery controller 214 selectively routes electrical power between the layers 102 and the voltage converters 206, and may disable at least one of the voltage converters 206 in response to exceeding a power or thermal limit. Shutting down all or part of the layers 102 can keep power dissipation and hotspot temperatures within specified limits. The 3-D power delivery controller 214 also enables independent voltage delivery in both lateral and vertical dimensions.

The 3-D power delivery controller 214 can also communicate with any existing on-chip power management controllers/units to predict power dissipation of tiles 104 and/or layers 102 in advance. Working in conjunction with other on-chip power management controllers/units enables the 3-D power delivery controller 214 to predicatively optimize power delivery for time (t+1) at time (t). The 3-D power delivery controller 214 can ensure that all tiles 104 and layers 102 receive requested power while balancing the impact of higher-power demanding tiles or regions such that supply noise fluctuations are minimized. Compensating for potential power delivery problems in a predictive manner can reduce such problems or prevent the problems from happening.

Figure 3:
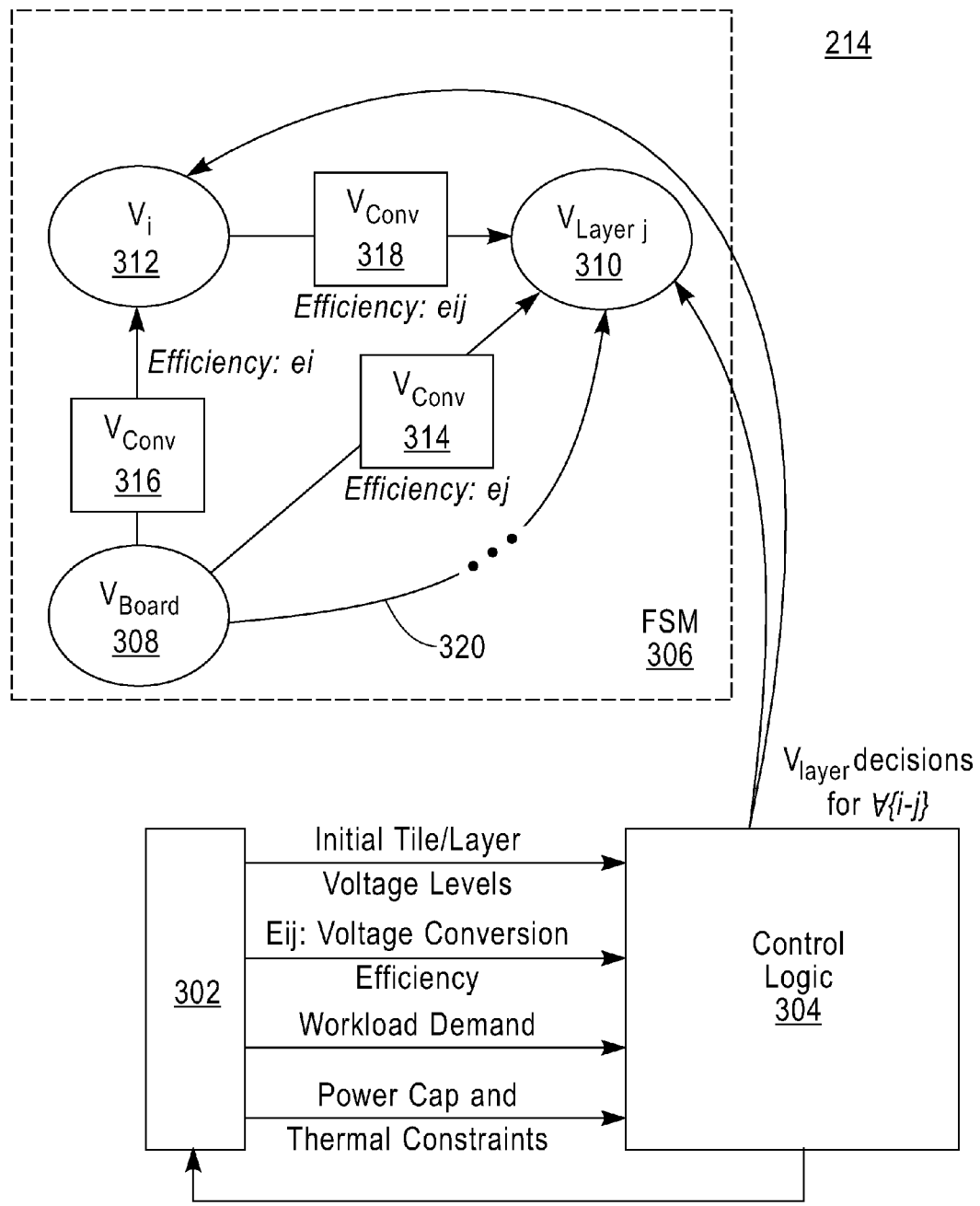
FIG. 3 depicts a three-dimensional power delivery controller for power delivery management in a heterogeneous three-dimensional stacked apparatus that may be implemented in exemplary embodiments.

FIG. 3 depicts additional details of the 3-D power delivery controller 214 of FIG. 2 in accordance with exemplary embodiments. As depicted in FIG. 2, the 3-D power delivery controller 214 includes a voltage control table 302 defining voltage requirements and conversion efficiencies for separate tiles 104a-104z of the heterogeneous 3-D stacked apparatus 100 of FIGS. 1 and 2. The voltage control table 302 is partially fixed at design time and partially updated at run time. At design time, efficiency ranges of the voltage converters 206 and target voltage ranges can be established. At run time, values in the voltage control table 302 can be dynamically updated, such as target values, estimated temperatures, estimated current drawn, target conversion efficiency in the predefined ranges, maximum power budget, layer power budget, and so forth. The voltage control table 302 can also include a variety of information, such as estimated IR drops, estimated tile temperatures, layer maximum power, and total maximum power for the heterogeneous 3-D stacked apparatus 100. An example of the contents of voltage control table 302 is provided in Table 1.

TABLE 1

Example of a voltage control table

| Location (Tile, Layer) | Vdd Required | Conversion Efficiency | Estimated Voltage Drop | Estimated Temperature | Layer Max Power | Total Max Power |
|---|---|---|---|---|---|---|
| $T_i, L_a$ | 1.01 V | 96% | 5 mV | 80° C. | 25 W | 110 W |
| $T_i, L_b$ | 0.98 V | 95% | 10 mV | 85° C. | 10 W | 110 W |
| $T_m, L_c$ | 1.01 V | 96% | 5 mV | 80° C. | 25 W | 110 W |
| $T_p, L_c$ | 0.95 V | 95% | 15 mV | 87° C. | 19 W | 110 W |
| $T_q, L_c$ | 0.95 V | 95% | 15 mV | 89° C. | 18 W | 110 W |

The 3-D power delivery controller 214 of FIG. 3 also includes control logic 304. The control logic 304 is configured to scan the voltage control table 302 for changes and calculate voltage regulation commands for voltage converters 206 of FIG. 2 in the heterogeneous three-dimensional stacked apparatus 100. The control logic 304 also distributes the calculated voltage regulation commands to the voltage converters 206 to control voltage on a tile basis. The control logic 304 may consider initial voltage levels of the layers 102 and tiles 104, voltage conversion efficiency at the voltage converters 206, workload demand, power capacity, and thermal constraints. The workload demand can be gauged based on current draw for each regulated voltage.

In an exemplary embodiment, the control logic 304 uses a finite state machine (FSM) 306 to evaluate alternative voltage conversion efficiencies of the voltage converters 206 of FIG. 2, as well as layer details for more efficient voltage delivery. The FSM 306 is configured to model voltage distribution paths through the layers 102 and voltage converters 206 of the heterogeneous 3-D stacked apparatus 100 according to the voltage requirements, conversion efficiencies, and estimated IR drops defined in the voltage control table 302. In the simplified example depicted in FIG. 3, state 308 represents the board-level voltage 212 of FIG. 2 as Vboard, state 310 is a voltage Vj at a targeted arbitrary layer, and state 312 is an intermediate voltage Vi at a possible voltage distribution path between Vboard and Vj. Voltage converters 314, 316, and 318 represent voltage converters 206 in the voltage distribution path between states 308, 310, and 312. Each of the voltage converters 314, 316, and 318 has an associated efficiency, ej, ei, and eij. The control logic 304 uses the inputs from table 302 to calculate an optimal solution to maximize overall efficiency while maintaining power and thermal limits.

Additional indirect control paths 320 can also be considered in both horizontal and vertical directions by the control logic 304. The number of possible paths for delivery of power to specific layers, regions, and tiles increases at higher layers in the heterogeneous 3-D stacked apparatus 100. For instance, there may be a larger number of potential power delivery paths to tiles on layer 102d of FIG. 2 than to tiles on layer 102b of FIG. 2, as horizontal and vertical voltage conversions can be performed in voltage converters 206a and 206c of layers 102a and 102c prior to reaching layer 102d. Therefore, the number of states and complexity of FSM 306 and control logic 304 is scalable and can be extended to any number of tiles, regions, and layers in a mesh configuration. Alternative configurations include controlling voltage conversions in a column or tree topology.

Figure 4:
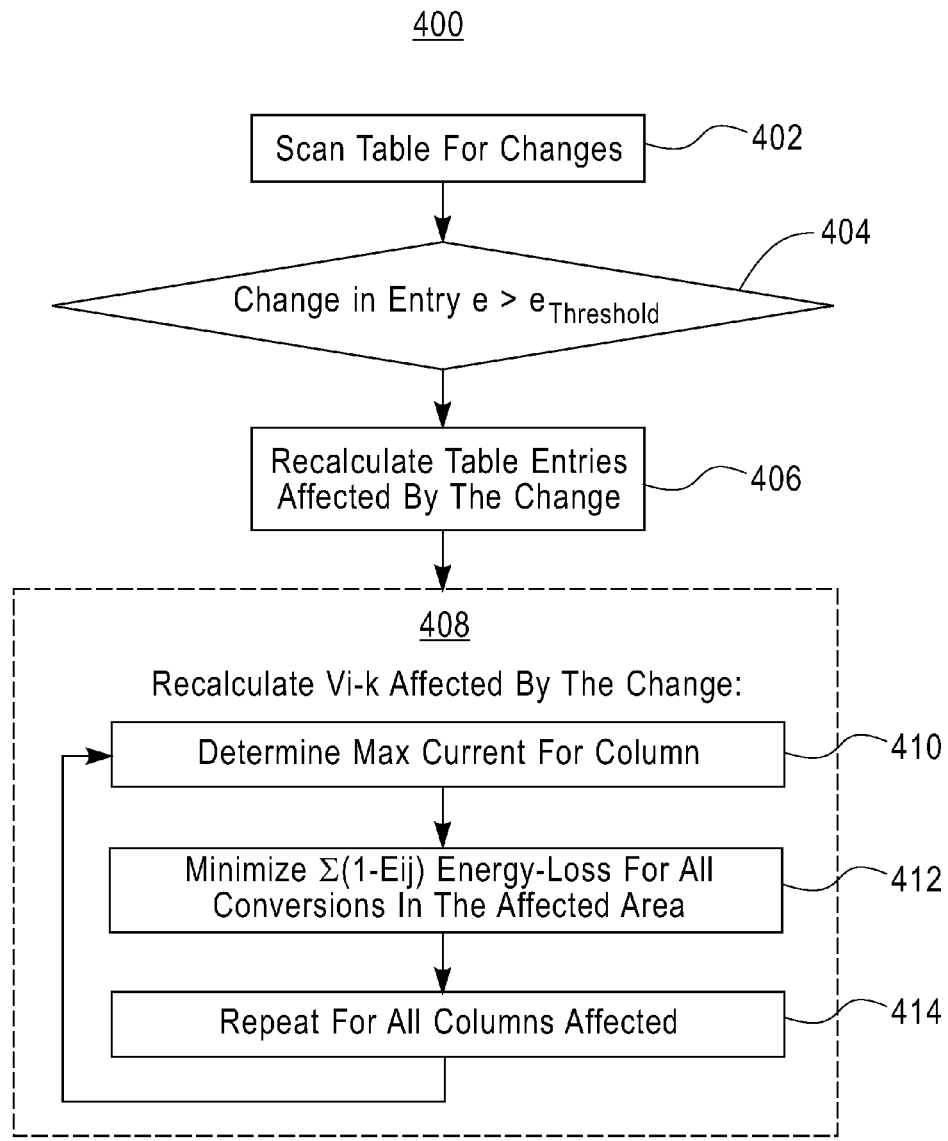
FIG. 4 depicts an example of a process for controlling power delivery in a heterogeneous three-dimensional stacked apparatus that may be implemented in exemplary embodiments.

FIG. 4 depicts an example of a process 400 for controlling power delivery in the heterogeneous 3-D stacked apparatus 100 of FIGS. 1 and 2 that may be implemented in control logic 304 of FIG. 3. Process 400 is a simplified example of an incremental execution of a single table update. At block 402, the control logic 304 reads the voltage control table 302 and scans the voltage control table 302 for changes. At block 404, a determination is made as to whether the changes exceed a predefined limit or a predicted future power requirement. At block 406, in response to locating changes in the voltage control table 302 exceeding the predefined limit or predicted future power requirement, the control logic 304 recalculates voltage control table 302 entries impacted by the changes.

At block 408, voltage levels are recalculated resulting from the changes. The recalculations can be performed iteratively for a predetermined maximum number of times to perform power optimization. At block 410, a maximum current for a vertical column 210 dependent upon the changes is determined. The maximum current value can be read from the voltage control table 302. At block 412, the control logic 304 calculates a minimum expected energy loss for voltage conversions dependent upon the changes, where Eij is conversion efficiency from Vi to Vj, and 1−Eij is energy loss due to conversion inefficiency. At block 414, additional affected vertical columns 210 are selected for analysis and the process flow returns to block 410. Based on the results of the recalculations, voltage regulation commands for voltage converters 206 are calculated and distributed. Values for the modeled voltage distribution paths of the FSM 306 are also updated. As part of determining efficient power delivery, the control logic 304 can select a minimized expected energy loss solution that maintains estimated tile temperatures below a thermal limit, and further maintains the layer maximum power and total maximum power. The calculation and distribution of voltage regulation commands for voltage converters 206 also establish interconnectivity among the voltage converters 206 by connecting active voltage converters 206 and bypassing inactive voltage converters 206.

Figure 5:
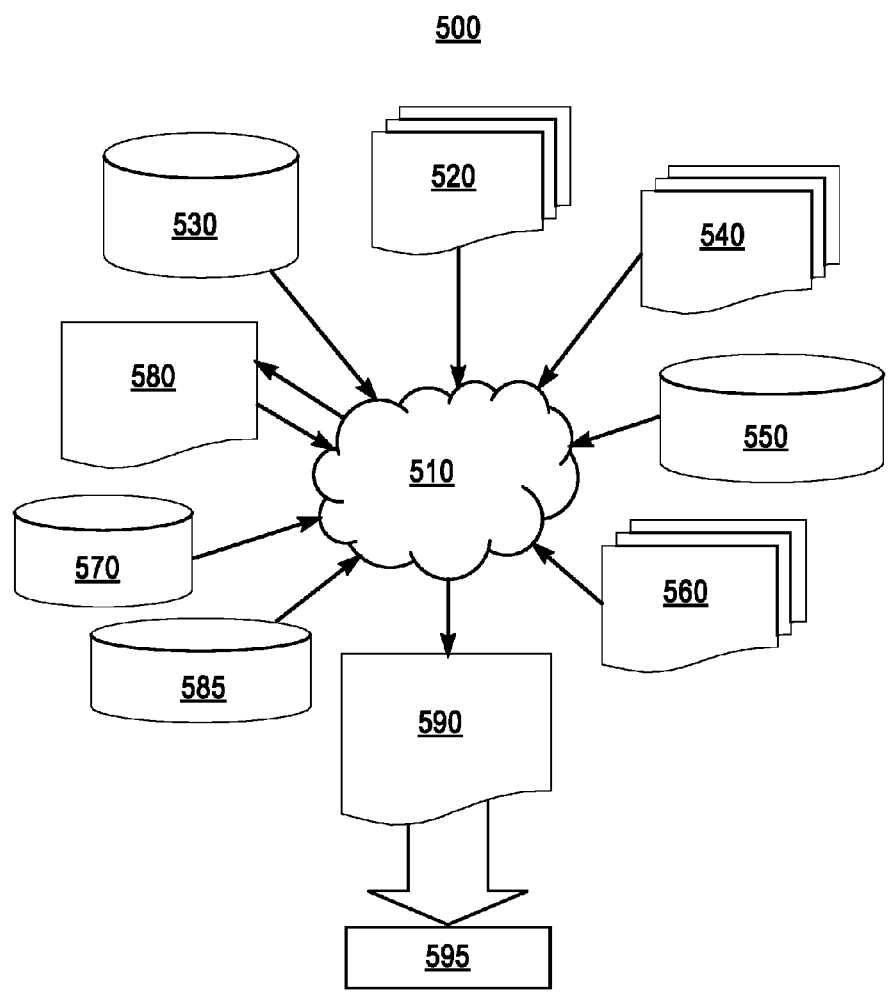
FIG. 5 is a flow diagram of a design process used in semiconductor design, manufacture, and/or test.

FIG. 5 shows a block diagram of an exemplary design flow 500 used for example, in semiconductor IC logic design, simulation, test, layout, and manufacture. Design flow 500 includes processes and mechanisms for processing design structures or devices to generate logically or otherwise functionally equivalent representations of the design structures and/or devices described above and shown in FIGS. 1-4. For example, the 3-D power delivery controller 214 of FIG. 2 can be a design structure residing in a layer 102 of the heterogeneous 3-D stacked apparatus 100 as programmable logic. The design structures processed and/or generated by design flow 500 may be encoded on machine readable transmission or storage media to include data and/or instructions that when executed or otherwise processed on a data processing system generate a logically, structurally, mechanically, or otherwise functionally equivalent representation of hardware components, circuits, devices, or systems. Design flow 500 may vary depending on the type of representation being designed.

FIG. 5 illustrates multiple such design structures including an input design structure 520 that is preferably processed by a design process 510. Design structure 520 may be a logical simulation design structure generated and processed by design process 510 to produce a logically equivalent functional representation of a hardware device. Design structure 520 may also or alternatively comprise data and/or program instructions that when processed by design process 510, generate a functional representation of the physical structure of a hardware device. Whether representing functional and/or structural design features, design structure 520 may be generated using electronic computer-aided design (ECAD) such as implemented by a core developer/designer. When encoded on a machine-readable data transmission, gate array, or storage medium, design structure 520 may be accessed and processed by one or more hardware and/or software modules within design process 510 to simulate or otherwise functionally represent an electronic component, circuit, electronic or logic module, apparatus, device, or system such as those shown in FIGS. 1-4. As such, design structure 520 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 510 preferably employs and incorporates hardware and/or software modules for synthesizing, translating, or otherwise processing a design/simulation functional equivalent of the components, circuits, devices, or logic structures shown in FIGS. 1-5 to generate a netlist 580 which may contain design structures such as design structure 520. Netlist 580 may comprise, for example, compiled or otherwise processed data structures representing a list of wires, discrete components, logic gates, control circuits, I/O devices, models, etc. that describes the connections to other elements and circuits in an integrated circuit design. Netlist 580 may be synthesized using an iterative process in which netlist 580 is resynthesized one or more times depending on design specifications and parameters for the device. As with other design structure types described herein, netlist 580 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 510 may include hardware and software modules for processing a variety of input data structure types including netlist 580. Such data structure types may reside, for example, within library elements 530 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 540, characterization data 550, verification data 560, design rules 570, and test data files 585 which may include input test patterns, output test results, and other testing information. Design process 810 may further include, for example, standard mechanical design processes such as stress analysis, thermal analysis, mechanical event simulation, process simulation for operations such as casting, molding, and die press forming, etc.

One of ordinary skill in the art of mechanical design can appreciate the extent of possible mechanical design tools and applications used in design process 510 without deviating from the scope and spirit of the invention. Design process 510 may also include modules for performing standard circuit design processes such as timing analysis, verification, design rule checking, place and route operations, etc.

Design process 510 employs and incorporates logic and physical design tools such as HDL compilers and simulation model build tools to process design structure 520 together with some or all of the depicted supporting data structures along with any additional mechanical design or data (if applicable), to generate a second design structure 590. Design structure 590 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 520, design structure 590 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-4. In one embodiment, design structure 590 may comprise a compiled, executable HDL simulation model that functionally simulates the devices shown in FIGS. 1-5.

Design structure 590 may also employ a data format used for the exchange of layout data of integrated circuits and/or symbolic data format (e.g. information stored in a GDSII (GDS2), GL1, OASIS, map files, or any other suitable format for storing such design data structures). Design structure 590 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-4. Design structure 590 may then proceed to a stage 595 where, for example, design structure 590: proceeds to tape-out, is released to manufacturing, is released to a mask house, is sent to another design house, is sent back to the customer, etc.

The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Design structure 520 may be tangibly embodied in a machine-readable medium for designing, manufacturing, or testing an integrated circuit, such as the heterogeneous 3-D stacked apparatus 100 of FIG. 1. The design structure 520 can include voltage control table 302 of FIG. 3 defining voltage requirements and conversion efficiencies for separate tiles 104 of heterogeneous three-dimensional stacked apparatus 100 of FIG. 1, where the heterogeneous three-dimensional stacked apparatus 100 includes multiple layers 102 arranged in a stacked configuration with multiple tiles 104 per layer 102. The design structure 520 may also include control logic 304 of FIG. 3 configured to scan the voltage control table 302 for changes, calculate voltage regulation commands for voltage converters 206 of FIG. 2 in the heterogeneous three-dimensional stacked apparatus 100, and distribute the calculated voltage regulation commands to the voltage converters 206 to control voltage on a tile basis.

The diagrams depicted herein are just examples. There may be many variations to these diagrams or the steps (or operations) described therein without departing from the spirit of the invention. For instance, the steps may be performed in a differing order, or steps may be added, deleted or modified. All of these variations are considered a part of the claimed invention.

Technical effects include efficient power delivery in a heterogeneous 3-D stacked apparatus. Incorporating one or more transitional voltage redistribution layers in one or more upper layers in a heterogeneous 3-D stacked apparatus can reduce power losses within the heterogeneous 3-D stacked apparatus. Accounting for factors such as required voltage, conversion efficiency, estimated IR drop, estimated tile temperature, workload demands, and power capacity can result in determining an optimal power delivery configuration in three dimensions, such that tiles in different layers can maintain supply voltage requirements with minimal wasted power. Periodically reexamining power management state variables and recalculating the power delivery solution as conditions change enables dynamic optimization of power delivery in the heterogeneous 3-D stacked apparatus.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated. Moreover, the use of the terms first, second, etc. do not denote any order or importance, but rather the terms first, second, etc. are used to distinguish one element from another.

The invention claimed is:

1. A heterogeneous three-dimensional stacked apparatus comprising:

multiple layers arranged in a stacked configuration comprising a lower layer configured to receive a board-level voltage and one or more upper layers stacked above the lower layer;

multiple tiles per layer, wherein each tile is designed to receive a separately regulated voltage;

at least one layer in the one or more upper layers comprising voltage converters providing the separately regulated voltage converted from the board-level voltage; and a three-dimensional power delivery controller configured to control electrical distribution between the board-level voltage and the voltage converters of the at least one layer as a function of one or more of: supply voltage requirements, voltage conversion efficiencies, estimated IR drops, estimated tile temperatures, estimated current drawn, layer maximum power, and total maximum power for the heterogeneous three-dimensional stacked apparatus, wherein the three-dimensional power delivery controller selectively routes electrical power between the layers and the voltage converters, including disabling at least one of the voltage converters in response to exceeding one of a power and thermal limit.

2. The heterogeneous three-dimensional stacked apparatus of claim 1 wherein the one or more upper layers include a processor layer with processing circuitry distributed in multiple tiles of the processor layer with independently regulated supply voltages.

3. The heterogeneous three-dimensional stacked apparatus of claim 1 wherein a plurality of the voltage converters are interconnected in one of: a tree, a column, and a mesh topology.

4. The heterogeneous three-dimensional stacked apparatus of claim 1 wherein one or more of the plurality of the voltage converters incorporate passive energy storage elements.

5. The heterogeneous three-dimensional stacked apparatus of claim 4 wherein the passive energy storage elements include one or more of:

deep trench capacitors and stacked capacitors fabricated in an embedded DRAM memory process.

* * * * *